(12) United States Patent
Kent et al.

(10) Patent No.: US 9,115,429 B2
(45) Date of Patent: Aug. 25, 2015

(54) DRY NON-PLASMA TREATMENT SYSTEM AND METHOD OF USING

(71) Applicant: Tokyo Electron Limited, Minato-ku, Tokyo (JP)

(72) Inventors: Martin Kent, Andover, MA (US); Eric J. Strang, Driftwood, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/466,146

(22) Filed: Aug. 22, 2014

(65) Prior Publication Data

US 2014/0360979 A1 Dec. 11, 2014

Related U.S. Application Data

(60) Division of application No. 12/772,232, filed on May 2, 2010, now Pat. No. 8,828,185, and a continuation of application No. 11/425,883, filed on Jun. 22, 2006, now Pat. No. 7,718,032.

(51) Int. Cl.

| | |
|---|---|
| C03C 25/68 | (2006.01) |
| C23F 1/02 | (2006.01) |
| H01L 21/306 | (2006.01) |
| H01L 21/02 | (2006.01) |
| H01L 21/033 | (2006.01) |
| H01L 21/311 | (2006.01) |

(Continued)

(52) U.S. Cl.
CPC . *C23F 1/02* (2013.01); *C01B 7/191* (2013.01); *C09K 13/08* (2013.01); *C23F 1/12* (2013.01); *H01L 21/02049* (2013.01); *H01L 21/0337* (2013.01); *H01L 21/0338* (2013.01); *H01L 21/30621* (2013.01); *H01L 21/31116* (2013.01); *H01L 21/67069* (2013.01); *H01L 21/67248* (2013.01); *H01L 21/67109* (2013.01); *H01L 21/68742* (2013.01)

(58) Field of Classification Search
CPC ............. H01L 21/3065; H01L 21/30655; H01L 21/3036; H01L 21/3062; C23F 1/12; C23F 1/02
USPC .............. 216/58, 63, 62, 66, 71, 55; 438/706, 438/710, 714, 715, 716
See application file for complete search history.

(56) References Cited

U.S. PATENT DOCUMENTS

| | | | |
|---|---|---|---|
| 4,492,610 A | 1/1985 | Okano et al. | |
| 4,716,957 A | 1/1988 | Thompson et al. | |

(Continued)

FOREIGN PATENT DOCUMENTS

WO 0170517 A1 9/2001

OTHER PUBLICATIONS

Chinese Office Action issued in Application No. 200780023348.0 mailed Dec. 4, 2009.

(Continued)

*Primary Examiner* — Lan Vinh

(57) ABSTRACT

A dry non-plasma treatment system and method for removing oxide material is described. The treatment system is configured to provide chemical treatment of one or more substrates, wherein each substrate is exposed to a gaseous chemistry under controlled conditions including surface temperature and gas pressure. Furthermore, the treatment system is configured to provide thermal treatment of each substrate, wherein each substrate is thermally treated to remove the chemically treated surfaces on each substrate.

12 Claims, 7 Drawing Sheets

(51) Int. Cl.
*H01L 21/67* (2006.01)
*C01B 7/19* (2006.01)
*C09K 13/08* (2006.01)
*C23F 1/12* (2006.01)
*H01L 21/687* (2006.01)

(56) References Cited

U.S. PATENT DOCUMENTS

| | | | |
|---|---|---|---|
| 4,838,978 | A | 6/1989 | Sekine et al. |
| 5,240,556 | A | 8/1993 | Ishikawa et al. |
| 5,273,588 | A | 12/1993 | Foster et al. |
| 5,282,925 | A | 2/1994 | Jeng et al. |
| 5,574,247 | A * | 11/1996 | Nishitani et al. ............... 118/708 |
| 5,622,566 | A | 4/1997 | Hosaka et al. |
| 5,622,639 | A | 4/1997 | Kitayama et al. |
| 5,733,426 | A | 3/1998 | Cox et al. |
| 5,769,952 | A | 6/1998 | Komino |
| 5,776,557 | A * | 7/1998 | Okano et al. .................. 427/579 |
| 5,802,856 | A | 9/1998 | Schaper et al. |
| 5,838,055 | A | 11/1998 | Kleinhenz et al. |
| 5,876,879 | A | 3/1999 | Kleinhenz et al. |
| 6,026,764 | A * | 2/2000 | Hwang ...................... 118/723 E |
| 6,071,815 | A | 6/2000 | Kleinhenz et al. |
| 6,074,951 | A | 6/2000 | Kleinhenz et al. |
| 6,099,651 | A | 8/2000 | Sajoto et al. |
| 6,165,271 | A | 12/2000 | Zhao et al. |
| 6,245,619 | B1 | 6/2001 | Boyd et al. |
| 6,258,170 | B1 | 7/2001 | Somekh et al. |
| 6,271,094 | B1 | 8/2001 | Boyd et al. |
| 6,284,006 | B1 | 9/2001 | Siefering et al. |
| 6,335,261 | B1 | 1/2002 | Natzle et al. |
| 6,527,865 | B1 | 3/2003 | Sajoto et al. |
| 6,807,971 | B2 | 10/2004 | Saito et al. |
| 6,951,821 | B2 | 10/2005 | Hamelin et al. |
| 7,029,536 | B2 | 4/2006 | Hamelin et al. |
| 7,049,612 | B2 * | 5/2006 | Quach et al. ............... 250/492.3 |
| 7,079,760 | B2 | 7/2006 | Hamelin et al. |
| 2001/0016226 | A1 | 8/2001 | Natzle et al. |
| 2002/0002947 | A1 | 1/2002 | Satoyoshi et al. |
| 2002/0011216 | A1 | 1/2002 | Nguyen |
| 2002/0015855 | A1 | 2/2002 | Sajoto et al. |
| 2002/0028555 | A1 | 3/2002 | Boyd et al. |
| 2002/0056417 | A1 | 5/2002 | Yonemizu et al. |
| 2002/0063110 | A1 | 5/2002 | Cantell et al. |
| 2002/0189757 | A1 | 12/2002 | Denton et al. |
| 2002/0195201 | A1 | 12/2002 | Beer et al. |
| 2004/0020601 | A1 | 2/2004 | Zhao et al. |
| 2004/0182315 | A1 | 9/2004 | Laflamme et al. |
| 2004/0182417 | A1 | 9/2004 | Hamelin et al. |
| 2004/0184792 | A1 | 9/2004 | Hamelin et al. |
| 2004/0185583 | A1 | 9/2004 | Tomoyasu et al. |
| 2004/0185670 | A1 | 9/2004 | Hamelin et al. |
| 2004/0200244 | A1 * | 10/2004 | Hong et al. .................. 68/12.26 |
| 2005/0142885 | A1 * | 6/2005 | Shinriki ......................... 438/706 |
| 2005/0211264 | A1 | 9/2005 | Kostenko et al. |
| 2005/0211386 | A1 | 9/2005 | Hamelin et al. |
| 2005/0218113 | A1 | 10/2005 | Yue |
| 2005/0218114 | A1 | 10/2005 | Yue et al. |
| 2005/0227494 | A1 | 10/2005 | Higuchi et al. |
| 2005/0269030 | A1 | 12/2005 | Kent et al. |
| 2005/0269291 | A1 | 12/2005 | Kent |
| 2006/0216941 | A1 | 9/2006 | Hasebe et al. |
| 2007/0238301 | A1 | 10/2007 | Cabral et al. |

OTHER PUBLICATIONS

International Search Report issued in Application No. PCT/US07/067479 mailed Jul. 14, 2008.
Written Opinion issued in Application No. PCT/US07/067479 mailed Jul. 14, 2008.
International Preliminary Report on Patentability issued in Application No. PCT/US07/061037 mailed Oct. 9, 2008.
International Search Report issued in International Application No. PCT/US07/61037 dated Nov. 1, 2007.
Written Opinion issued in International Application No. PCT/US07/61037 dated Nov. 1, 2007.
Office Action issued in U.S. Appl. No. 11/390,470 mailed Nov. 7, 2008.

* cited by examiner

US 9,115,429 B2

DRY NON-PLASMA TREATMENT SYSTEM AND METHOD OF USING

CROSS-REFERENCE TO RELATED APPLICATIONS

This application is a divisional of and claims the benefit of priority under 35 USC §121 from U.S. Ser. No. 12/772,232, filed May 2, 2010, which claims the benefit of priority under 35 USC §120 from U.S. Ser. No. 11/425,883, filed Jun. 22, 2006 and now issued as U.S. Pat. No. 7,718,032. This application is related to U.S. patent application Ser. No. 10/705, 200, entitled "Processing System and Method for Chemically Treating a Substrate", filed on Nov. 12, 2003 and issued as U.S. Pat. No. 6,951,821; U.S. patent application Ser. No. 10/704,969, entitled "Processing System and Method for Thermally Treating a Substrate", filed on Nov. 12, 2003 and issued as U.S. Pat. No. 7,079,760; U.S. patent application Ser. No. 10/705,201, entitled "Processing System and Method for Treating a Substrate", filed on Nov. 12, 2003 and issued as U.S. Pat. No. 7,029,536; U.S. patent application Ser. No. 11/390,470, entitled "Batch Processing System and Method for Performing Chemical Oxide Removal", filed on Mar. 28, 2006 and published as US 2007/0238301; U.S. patent application Ser. No. 10/859,975, entitled "Method of Operating a Processing System for Treating a Substrate", filed on Jun. 4, 2004 and published as US 2005/0269291; and U.S. patent application Ser. No. 10/860,149, entitled "Processing System and Method for Treating a Substrate", filed on Jun. 4, 2004 and issued as U.S. Pat. No. 7,651,583. The entire contents of all of these applications are herein incorporated by reference in their entirety.

BACKGROUND OF THE INVENTION

1. Field of the Invention

The present invention relates to a dry non-plasma treatment system and method for treating a substrate, and more particularly to a dry non-plasma treatment system and method for chemical and thermal treatment of a substrate.

2. Description of Related Art

In material processing methodologies, pattern etching comprises the application of a thin layer of light-sensitive material, such as photoresist, to an upper surface of a substrate, that is subsequently patterned in order to provide a mask for transferring this pattern to the underlying thin film during etching. The patterning of the light-sensitive material generally involves exposure by a radiation source through a reticle (and associated optics) of the light-sensitive material using, for example, a micro-lithography system, followed by the removal of the irradiated regions of the light-sensitive material (as in the case of positive photoresist), or non-irradiated regions (as in the case of negative resist) using a developing solvent.

Additionally, multi-layer and hard masks can be implemented for etching features in a thin film. For example, when etching features in a thin film using a hard mask, the mask pattern in the light-sensitive layer is transferred to the hard mask layer using a separate etch step preceding the main etch step for the thin film. The hard mask can, for example, be selected from several materials for silicon processing including silicon dioxide ($SiO_2$), silicon nitride ($Si_3N_4$), and carbon, for example.

In order to reduce the feature size formed in the thin film, the hard mask can be trimmed laterally using, for example, a two-step process involving a chemical treatment of the exposed surfaces of the hard mask layer in order to alter the surface chemistry of the hard mask layer, and a post treatment of the exposed surfaces of the hard mask layer in order to desorb the altered surface chemistry.

SUMMARY OF THE INVENTION

The present invention relates to a dry non-plasma treatment system and method for treating a substrate, and to a dry non-plasma treatment system and method for chemically and thermally treating a substrate.

In one embodiment, a treatment system for removing material on a substrate is described. The treatment system comprises: a temperature controlled process chamber configured to contain a substrate and configured to facilitate a non-plasma environment; a temperature controlled substrate holder mounted within the temperature controlled process chamber, and configured to support the substrate and configured to control a temperature of the substrate when the substrate is resting on an upper surface of the temperature controlled substrate holder; a vacuum pumping system coupled to the temperature controlled process chamber; a chemical treatment system coupled to the temperature controlled process chamber and configured to introduce a process gas to the temperature controlled process chamber, wherein the process gas chemically alters exposed surface layers on the substrate; a thermal treatment system, separate from the temperature-controlled substrate holder, coupled to the temperature controlled process chamber and configured to elevate the temperature of the substrate in the temperature controlled process chamber, wherein the elevated temperature causes evaporation of the chemically altered surface layers; and a controller coupled to the temperature controlled substrate holder, the chemical treatment system, and the thermal treatment system and configured to control the amount of the process gas introduced to the substrate, and the temperature to which the substrate is set.

In another embodiment, a method of removing material on a substrate is described. The method comprises: disposing a substrate on a temperature controlled substrate holder mounted within a temperature controlled process chamber, the temperature controlled process chamber configured to facilitate a non-plasma environment, and the temperature controlled substrate holder configured to support the substrate and configured to control a temperature of the substrate when the substrate is resting on an upper surface of the temperature controlled substrate holder; evacuating the temperature controlled process chamber using a pumping system coupled to the temperature controlled process chamber; chemically treating the substrate using a chemical treatment system coupled to the temperature controlled process chamber by exposing the substrate to a process gas composition selected to chemically alter exposed surface layers on the substrate; and following the chemical treating, thermally treating the substrate using a thermal treatment system, separate from the temperature-controlled substrate holder, coupled to the temperature controlled process chamber by heating the substrate to a temperature sufficient to cause evaporation of the chemically altered surface layers.

DETAILED DESCRIPTION OF EXEMPLARY EMBODIMENTS

In the following description, for purposes of explanation and not limitation, specific details are set forth, such as a particular geometry of the treatment system and descriptions of various components and processes. However, it should be understood that the invention may be practiced in other embodiments that depart from these specific details.

Figure 1:
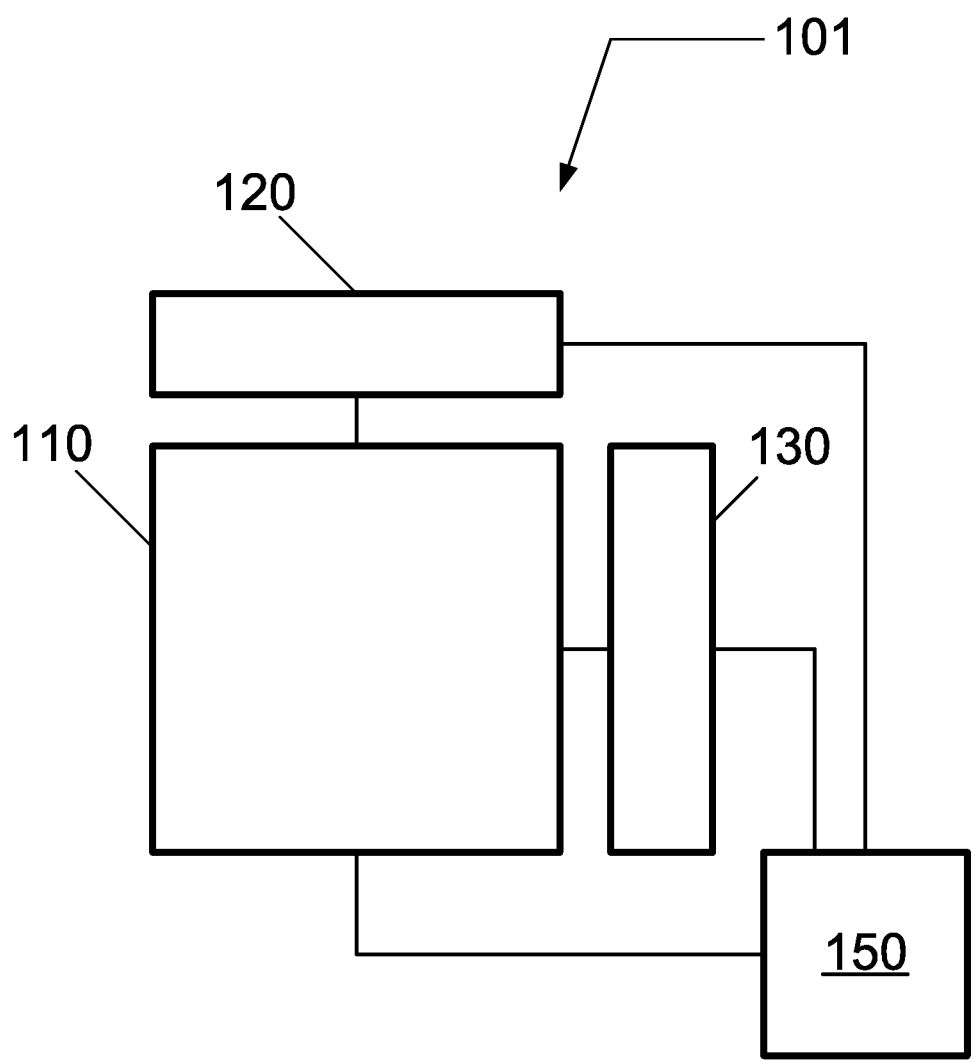
FIG. 1 presents a block diagram of a dry non-plasma treatment system for performing a chemical oxide removal process according to an embodiment of the present invention.

According to one embodiment, FIG. 1 presents a treatment system 101 for processing a substrate using a dry, non-plasma, treatment process, such as a chemical oxide removal process, to, for example, trim an oxide mask or remove native oxide or remove a $SiO_x$-containing residue. For example, the treatment system 101 is configured to facilitate a chemical treatment process during which oxide material on the substrate is chemically altered and a thermal treatment process during which chemically altered substrate material is desorbed.

FIG. 1 presents a block diagram of a treatment system 101 for treating the oxide material on a substrate. Treatment system 101 includes a process chamber 110 configured to process the substrate, a chemical treatment system 120 coupled to the process chamber 110 and configured to introduce a process gas to the substrate mounted in process chamber 110, a thermal treatment system 130 coupled to process chamber 110 and configured to elevate the temperature of the substrate, and a controller 150 coupled to the process chamber 110, the chemical treatment system 120 and the thermal treatment system 130, and configured to control the treatment system 101 according to a process recipe.

For example, the chemical treatment system 120 is configured to introduce a process gas comprising a first gaseous component having as an incipient ingredient HF and an optional second gaseous component having as an incipient ingredient ammonia ($NH_3$). The two gaseous components may be introduced together, or independently of one another. For example, independent gas/vapor delivery systems may be used to introduce each gaseous component. Additionally, the chemical treatment system 120 can further include a temperature control system for elevating the temperature of the vapor delivery system in order to prevent the condensation of process vapor therein.

Additionally, either gaseous component, or both, can be introduced with a carrier gas, such as an inert gas. The inert gas can comprise a noble gas, such as argon. Of course, other gasses can also be included in the process gas. The chemical treatment of the oxide material on the substrate by exposing this material to the two gaseous components causes a chemical alteration of the oxide material surface to a self-limiting depth. During the chemical treatment of the oxide material on the substrate, the substrate temperature can be controlled. For example, the substrate temperature can be set to a chemical treatment temperature less than 100 degrees C.

Referring still to FIG. 1, the thermal treatment system 130 can elevate the temperature of the substrate to a temperature above the chemical treatment temperature, or a temperature range from approximately 50 degrees C. to approximately 450 degrees C., and desirably, the substrate temperature can range from approximately 100 degrees C. to approximately 300 degrees C. For example, the substrate temperature may range from approximately 100 degrees C. to approximately 200 degrees C. The thermal treatment of the chemically altered oxide surface layers causes the evaporation of these surface layers.

Controller 150 includes a microprocessor, memory, and a digital I/O port (potentially including D/A and/or ND converters) capable of generating control voltages sufficient to communicate and activate inputs to the process chamber 110, the chemical treatment system 120 and the thermal treatment system as well as monitor outputs from these systems. A program stored in the memory is utilized to interact with the systems 120 and 130 according to a stored process recipe.

Alternately, or in addition, controller 150 can be coupled to a one or more additional controllers/computers (not shown), and controller 150 can obtain setup and/or configuration information from an additional controller/computer.

In FIG. 1, singular processing elements (120 and 130) are shown, but this is not required for the invention. The processing system 101 can comprise any number of processing elements having any number of controllers associated with them in addition to independent processing elements.

The controller 150 can be used to configure any number of processing elements (120 and 130), and the controller 150 can collect, provide, process, store, and display data from processing elements. The controller 150 can comprise a number of applications for controlling one or more of the processing elements. For example, controller 150 can include a graphic user interface (GUI) component (not shown) that can provide easy to use interfaces that enable a user to monitor and/or control one or more processing elements.

The processing system 101 can also comprise a pressure control system (not shown). The pressure control system can be coupled to the processing chamber 110, but this is not required. In alternate embodiments, the pressure control system can be configured differently and coupled differently. The pressure control system can include one or more pressure valves (not shown) for exhausting the processing chamber 110 and/or for regulating the pressure within the processing chamber 110. Alternately, the pressure control system can also include one or more pumps (not shown). For example, one pump may be used to increase the pressure within the processing chamber, and another pump may be used to evacuate the processing chamber 110. In another embodiment, the pressure control system can comprise seals for sealing the processing chamber.

Furthermore, the treatment system 101 can comprise an exhaust control system. The exhaust control system can be coupled to the processing chamber 110, but this is not required. In alternate embodiments, the exhaust control system can be configured differently and coupled differently. The exhaust control system can include an exhaust gas collection vessel (not shown) and can be used to remove contaminants from the processing fluid. Alternately, the exhaust control system can be used to recycle the processing fluid.

Figure 2:
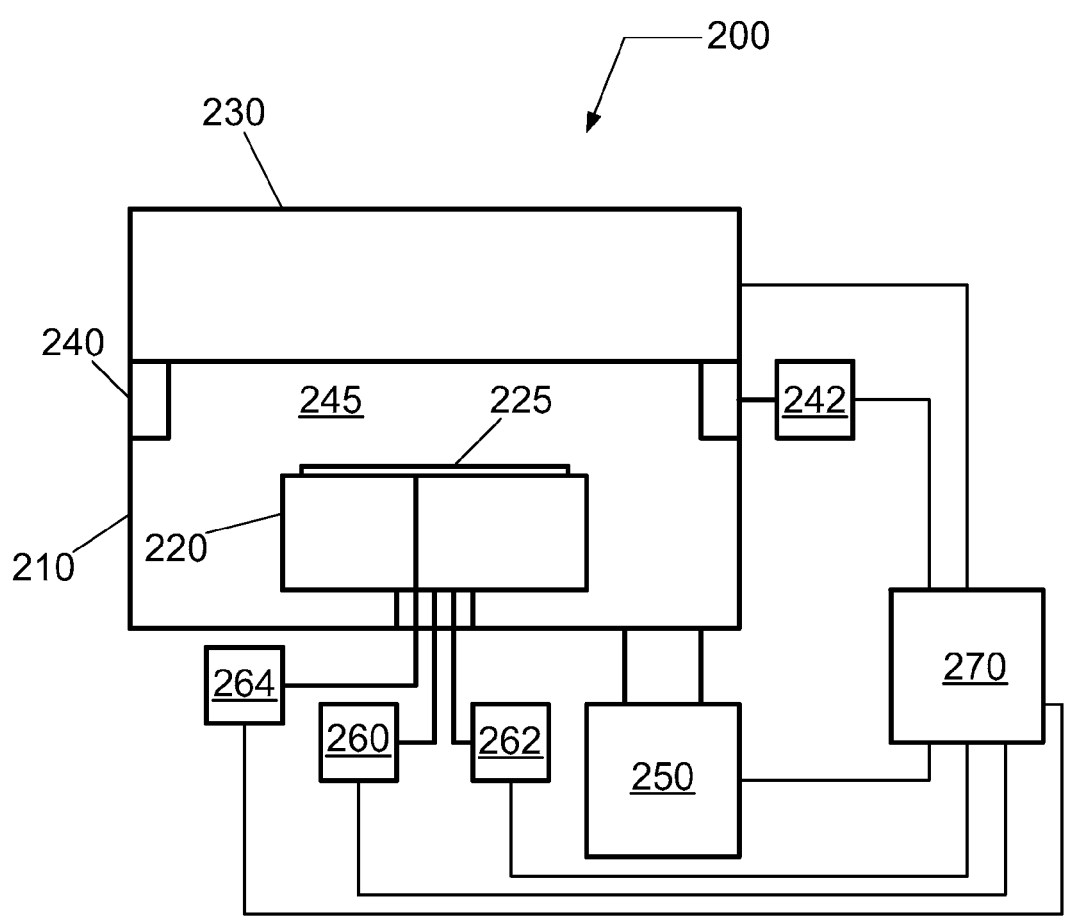
FIG. 2 presents a dry non-plasma treatment system for performing a dry, non-plasma chemical removal process according to another embodiment of the present invention.
Figure 3A:
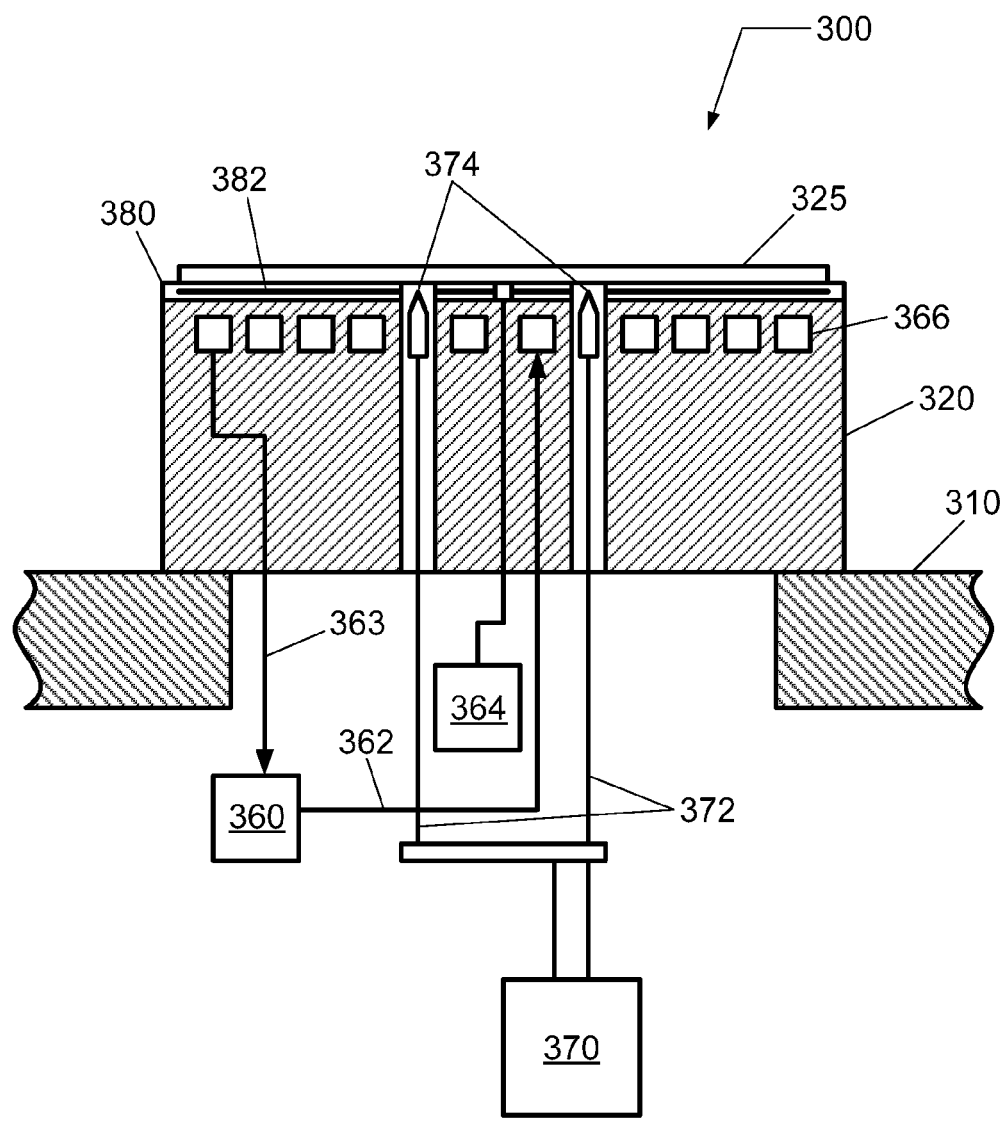
FIGS. 3A and 3B present a substrate holder for performing a dry, non-plasma chemical removal process according to another embodiment of the present invention.
Figure 3B:
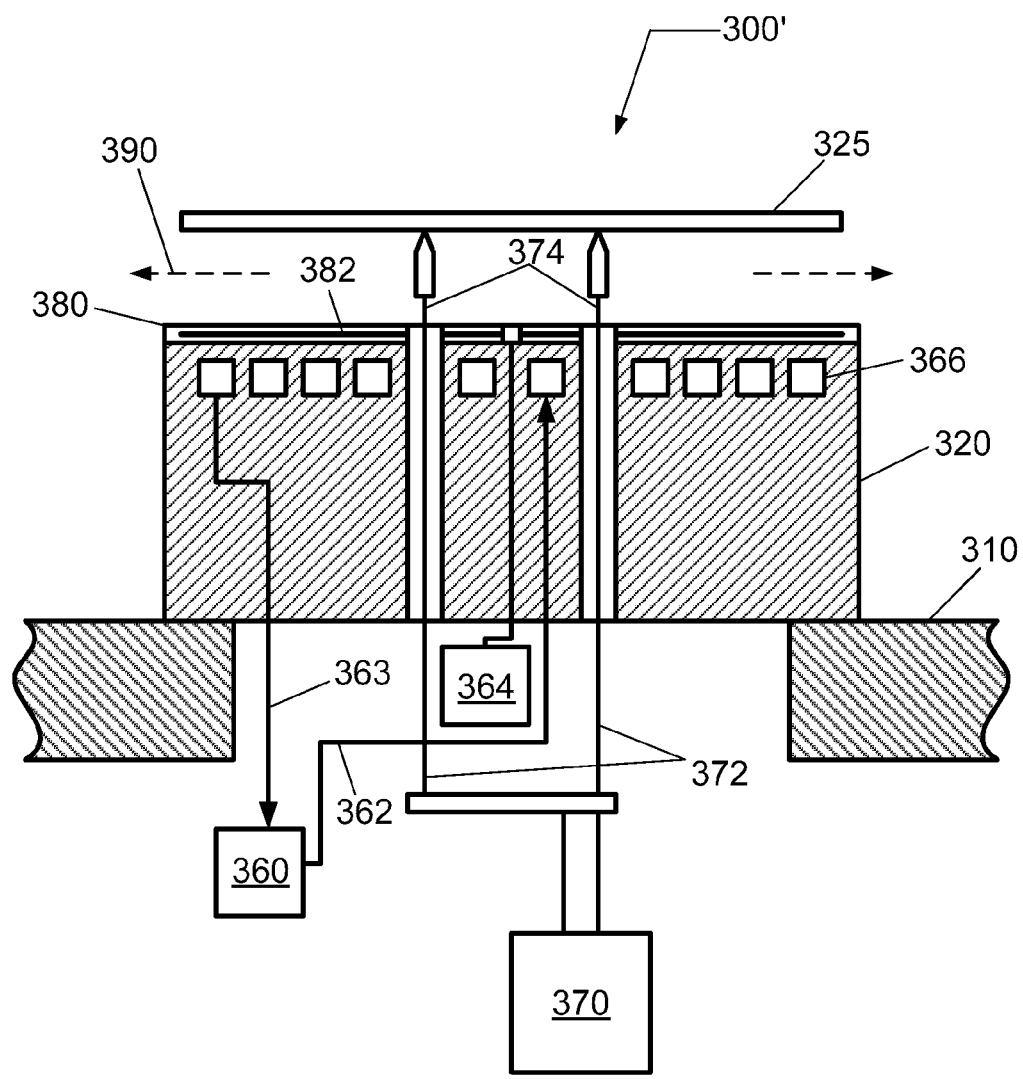

Referring now to FIG. 2, a simplified block diagram of a treatment system 200 is shown according to another embodiment. The treatment system 200 comprises a treatment chamber 210, a temperature controlled substrate holder 220 configured to be substantially thermally isolated from the treatment chamber 210 and configured to support a substrate 225, a vacuum pumping system 250 coupled to the treatment chamber 210 to evacuate the treatment chamber 210, a chemical distribution system 240 coupled to treatment chamber 210 and configured to introduce a process gas into a process space 245 in order to chemically treat substrate 225, and a radiative heating system 230 coupled to treatment chamber 210 and configured to thermally treat substrate 225. Substrate 225 can be transferred into and out of treatment chamber 210 through via a substrate transfer system (not shown) through a transfer opening (not shown).

The chemical distribution system 240 is configured to introduce a process gas configured to, for example, chemically alter oxide material on substrate 225. The chemical distribution system 240 is configured to introduce one or more process gases including, but not limited to, HF, $NH_3$, $N_2$, $H_2$, $O_2$, CO, $CO_2$, NO, $NO_2$, $N_2O$, $C_xF_y$ (where x, y are integers), $C_xH_zF_y$ (where x, y, z are integers), etc. For example, the process gas can comprise a first gaseous component having as an incipient ingredient HF and an optional second gaseous component having as an incipient ingredient ammonia ($NH_3$). The two gaseous components may be introduced together, or independently of one another using a gas supply system 242. For example, independent gas/vapor supply systems may be used to introduce each gaseous component. Additionally, the chemical distribution system 240 can further include a temperature control system for elevating the temperature of the chemical distribution system 240 in order to prevent the condensation of process vapor therein. Additionally, either gaseous component, or both, can be introduced with a carrier gas, such as an inert gas. The inert gas can comprise a noble gas, such as argon. Of course, other gaseous can also be included.

As illustrated in FIG. 2, the chemical distribution system 240 can be arranged beyond a peripheral edge of substrate 225. The chemical distribution system 240 may comprise a plurality of injection orifices, or nozzles, distributed about the circumference of process space 245. Additionally, alternating groups of one or more orifices, or nozzles, may be used to independently introduce each gaseous component, e.g., HF and ammonia. Alternatively, the chemical distribution system 240 can be arranged within the radiative heating system 230. Alternatively, the chemical distribution system 240 can be arranged within an upper assembly above substrate 225, while radiative heating system 230 is located beyond a peripheral edge of the chemical distribution system 240 yet within view of substrate 225. Chemical distribution system 240 can be a multi-zone fluid distribution system to adjust the flow of process gas to multiple zones within treatment chamber 210.

Additionally, the radiative heating system 230 is configured to heat substrate 225 in order to, for example, desorb chemically altered oxide material on substrate 225. The radiative heating system 230 can comprise one or more heat lamps. Each heat lamp may, for example, include a tungsten-halogen lamp. Heat lamps, arranged in groups of one or more lamps, may be utilized to spatially adjust the heating of substrate 225. The radiative heating system 230 further comprises a window that is configured to preserve the vacuum conditions in process chamber 210 and that is substantially transparent to infrared (IR) electromagnetic (EM) radiation. For example, the window may comprise quartz or desirably sapphire. Although, the window (when fabricated of quartz) may be consumed in the dry non-plasma process, the thickness may be selected to be sufficiently thick to reduce the frequency of its replacement and the associated replacement costs.

Referring still to FIG. 2, the substrate holder 220 comprises a substrate temperature control system 260 configured to perform at least one of monitoring, adjusting or controlling or a combination of two or more thereof, the temperature of substrate holder 220 or substrate 225 or both. For example, the substrate holder 220 and substrate temperature control system 260 may comprise a substrate clamping system (i.e., electrical or mechanical clamping system) to improve thermal contact between substrate 225 and substrate holder 220, a heating system, a cooling system, a substrate backside gas supply system for improved thermal conductance between the substrate 225 and the substrate holder 220, a temperature sensor, etc.

Additionally, the substrate holder 220 comprises a substrate lift system 262 including a lift pin assembly (not shown) capable of raising and lowering three or more lift pins in order to vertically transfer substrate 225 to and from an upper surface of the substrate holder 220 and a transfer plane in the process chamber 210, and to vertically transfer substrate 225 to and from an upper surface of the substrate holder 220 and a heating plane in the process chamber 210. Furthermore, the substrate holder 220 can comprise a backside gas supply system 264 configured to supply gas to the backside of substrate 225.

During chemical treatment of substrate 225, substrate 225 rests on substrate holder 220 and the temperature is controlled to a chemical treatment temperature less than approximately 100 degrees C. while the substrate 225 is exposed to process gas configured to chemically alter oxide material on substrate 225. During chemical treatment, substrate 225 may be clamped to the substrate holder 220 and a flow of backside gas can be initiated from a backside gas supply system 264 to affect improved thermal conductance between the substrate 225 and the substrate holder 220.

Following the chemical treatment of substrate 225, the temperature of substrate 225 is elevated using radiative heating system 230 in order to desorb the chemically altered oxide material. During the thermal treatment of substrate 225, the substrate 225 can be raised above substrate holder 220 and displaced from the substrate holder 220 to the heating plane using substrate lift system 262 by a distance sufficient to substantially thermally decouple the substrate 225 from substrate holder 220. Furthermore, the substrate 225 may be lifted to close proximity with the radiative heating system 230 in order to reduce the extent to which other chamber components see the radiative heating system 230 during heating. Preferably, substrate 225 is heated while other chamber components are not. Additionally, when substrate 225 is raised above substrate holder 220, an optional flow of purge gas from backside gas supply system 264 can be conducted in order to reduce contamination of the backside of substrate 225 during the desorption process.

Referring now to FIGS. 3A, 3B, 4A and 4B, a substrate holder assembly 300 is depicted according to another embodiment. The substrate holder assembly 300 comprises substrate holder 320 configured to support substrate 325 and configured to be coupled to process chamber 310. The substrate holder assembly 300 further comprises an electrostatic clamping (ESC) system 380 having a clamp electrode 382 configured to electrically clamp substrate 225 to substrate holder 220.

Additionally, the substrate holder assembly 300 comprises a substrate temperature control system 360. The substrate temperature control system 360 includes a heat exchanger configured to circulate a heat transfer fluid through a fluid channel 366 disposed in substrate holder 320 by supplying the heat transfer fluid through an inlet fluid supply line 362 and receiving the heat transfer fluid through an outlet fluid supply line 363. By adjusting the fluid temperature in the heat exchanger, the temperature of substrate holder 320 can be adjusted. Although only a single zone fluid circulation system is shown, the circulation system may comprise multiple fluid zones.

Furthermore, the substrate holder assembly 300 comprises a substrate lift system 370 including a lift pin assembly capable of raising and lowering three or more lift pins in order to vertically transfer substrate 325 to and from an upper surface of the substrate holder 320 and a transfer plane in the process chamber 310.

In the lift pin assembly, substrate lift pins 372 can be coupled to a common lift pin element, and can be lowered to below the upper surface of substrate holder 320. A drive mechanism utilizing, for example, an electric drive system (having an electric stepper motor and threaded rod) or a pneumatic drive system (having an air cylinder), provides means for raising and lowering the common lift pin element. Substrate 325 can be transferred into and out of process chamber 310 through a gate valve (not shown) and chamber feed-through passage, aligned on the transfer plane, via a robotic transfer system (not shown), and received by the substrate lift pins. Once the substrate 325 is received from the transfer system, it can be lowered to the upper surface of the pedestal 320 by lowering the substrate lift pins 372 (see FIGS. 3A and 4A). Moreover, the substrate 325 may be raised above substrate holder 320 during the heating of substrate 325 (see FIGS. 3B and 4B). The substrate lift pins 372 may comprise pin caps 374 fabricated from a thermally insulating material, such as quartz or sapphire, in order to thermally decouple the substrate 325 from the substrate lift pins 372.

Further yet, substrate holder assembly 320 comprises a backside gas supply system 364 configured to supply a heat transfer gas, or a purge gas, or both to the backside of substrate 325. During chemical treatment of substrate 325, the substrate 325 can be clamped to substrate holder 320 using ESC system 380 while the backside gas supply system 364 supplies heat transfer gas, such as helium, to the backside of substrate 325 in order to improve the thermal contact between substrate 325 and substrate holder 320 (see FIGS. 3A and 4A). The substrate temperature control system can then be utilized to adjust the temperature of substrate 325. During the thermal treatment of substrate 325, the substrate 325 can be raised above the substrate holder using the substrate lift system 370 while the backside gas supply system 364 supplies a purge gas flow 390 to the backside of substrate 325 in order to reduce contamination of the substrate backside (see FIGS. 3B and 4B).

During chemical treatment of substrate 325, substrate 325 rests on substrate holder 320 and the temperature is controlled to a chemical treatment temperature less than approximately 100 degrees C. while the substrate 325 is exposed to process gas configured to chemically alter oxide material on substrate 325. During chemical treatment, substrate 325 may be clamped to the substrate holder 320 using ESC system 380 and a flow of backside gas can be initiated from backside gas supply system 364 in order to affect improved thermal conductance between the substrate 325 and the substrate holder 320 (see FIGS. 3A and 4A).

Following the chemical treatment of substrate 325, the temperature of substrate 325 is elevated using a radiative heating system 330 above substrate 325 in order to desorb the chemically altered oxide material. During the thermal treatment of substrate 325, the substrate 325 can be raised above substrate holder 320 and displaced from the substrate holder 320 using substrate lift system 362 by a distance sufficient to substantially thermally decouple the substrate 325 from substrate holder 320. Furthermore, the substrate 325 may be lifted to close proximity with the radiative heating system 330 in order to reduce the extent to which other chamber components see the radiative heating system 330 during heating. Preferably, substrate 325 is heated while other chamber components are not. Additionally, when substrate 325 is raised above substrate holder 320, an optional flow of purge gas from backside gas supply system 364 can be conducted in order to reduce contamination of the backside of substrate 325 during the desorption process (see FIGS. 3B and 4B).

Figure 4A:
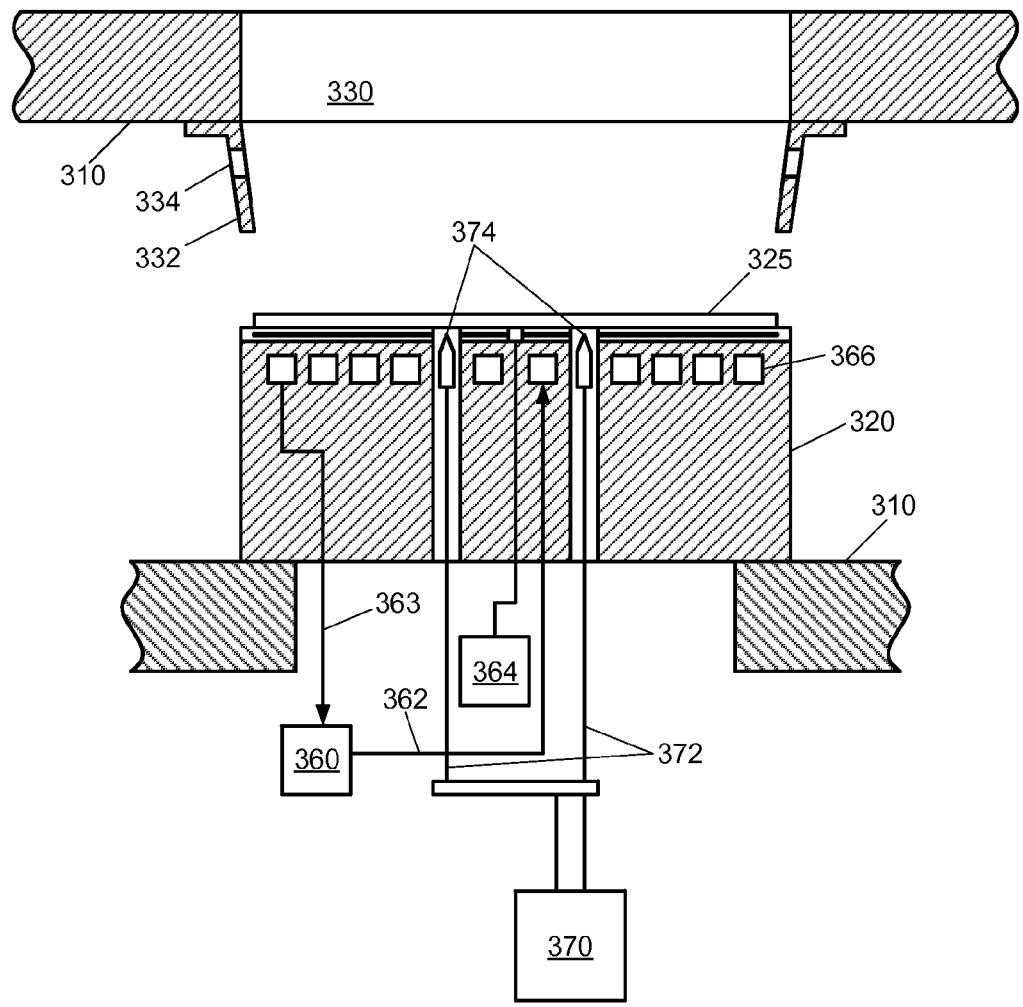
FIGS. 4A and 4B present a substrate holder for performing a dry, non-plasma chemical removal process according to another embodiment of the present invention.
Figure 4B:
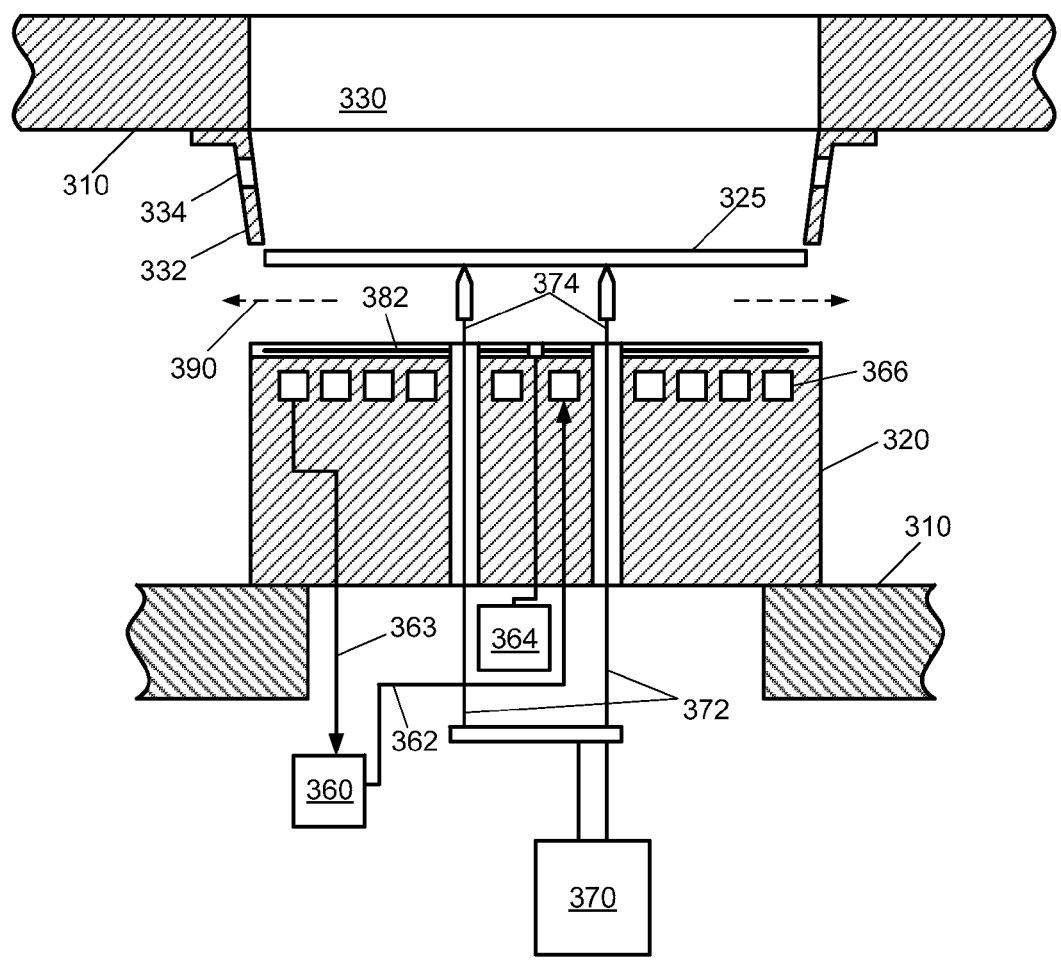

Furthermore, referring to FIGS. 4A and 4B, a radiation shield 332 may be utilized to reduce the heating of other chamber components during the heating of substrate 325. Substrate 325 can, for example, be lifted to close proximitiy with the bottom of radiation shield 332. The radiation shield 332 may comprise one or more openings 334 in order to permit the passage of gaseous material originating from substrate 325 during heating. Additionally, a purge gas, such as an inert gas (e.g., a noble gas, $N_2$, etc.), can be introduced to the space enclosed by radiation shield 332, substrate 325 and radiative heating system 330 during thermal treatment of substrate 325. Furthermore, the radiation shield may be coupled to the upper portion of process chamber 310. The radiation shield may be a bare metal shield or a ceramic shield, or it may be an anodized metal shield or coated metal shield, for example.

Referring again to FIG. 2, vacuum pumping system 250 can comprise a vacuum pump and a gate valve for adjusting the chamber pressure. Vacuum pumping system 250 can, for example, include a turbo-molecular vacuum pump (TMP) capable of a pumping speed up to about 5000 liters per second (and greater). For example, the TMP can be a Seiko STP-A803 vacuum pump, or an Ebara ET1301W vacuum pump. TMPs are useful for low pressure processing, typically less than about 50 mTorr. For high pressure (i.e., greater than about 100 mTorr) or low throughput processing (i.e., no gas flow), a mechanical booster pump and dry roughing pump can be used.

Referring still to FIG. 2, treatment system 200 can further comprise a controller 270 having a microprocessor, memory, and a digital I/O port capable of generating control voltages sufficient to communicate and activate inputs to treatment system 200 as well as monitor outputs from treatment system 200 such as temperature and pressure sensing devices. Moreover, controller 270 can be coupled to and can exchange information with substrate holder 220, chemical distribution system 240, gas supply system 242, radiative heating system 230, vacuum pumping system 250, substrate temperature control system 260, substrate lift system 262, and backside gas supply system 264. For example, a program stored in the memory can be utilized to activate the inputs to the aforementioned components of treatment system 200 according to a process recipe. One example of controller 270 is a DELL PRECISION WORKSTATION 610™, available from Dell Corporation, Austin, Tex.

The controller 270 may also be implemented as a general purpose computer, processor, digital signal processor, etc., which causes a substrate processing apparatus to perform a portion or all of the processing steps of the invention in response to the controller 290 executing one or more sequences of one or more instructions contained in a computer readable medium. The computer readable medium or memory for holding instructions programmed according to the teachings of the invention and for containing data structures, tables, records, or other data described herein. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave, or any other medium from which a computer can read.

The controller 270 may be locally located relative to the treatment system 200, or it may be remotely located relative to the treatment system 200 via an internet or intranet. Thus, the controller 270 can exchange data with the treatment system 200 using at least one of a direct connection, an intranet, and the internet. The controller 270 may be coupled to an intranet at a customer site (i.e., a device maker, etc.), or coupled to an intranet at a vendor site (i.e., an equipment manufacturer). Furthermore, another computer (i.e., controller, server, etc.) can access controller 270 to exchange data via at least one of a direct connection, an intranet, and the internet.

Figure 5:
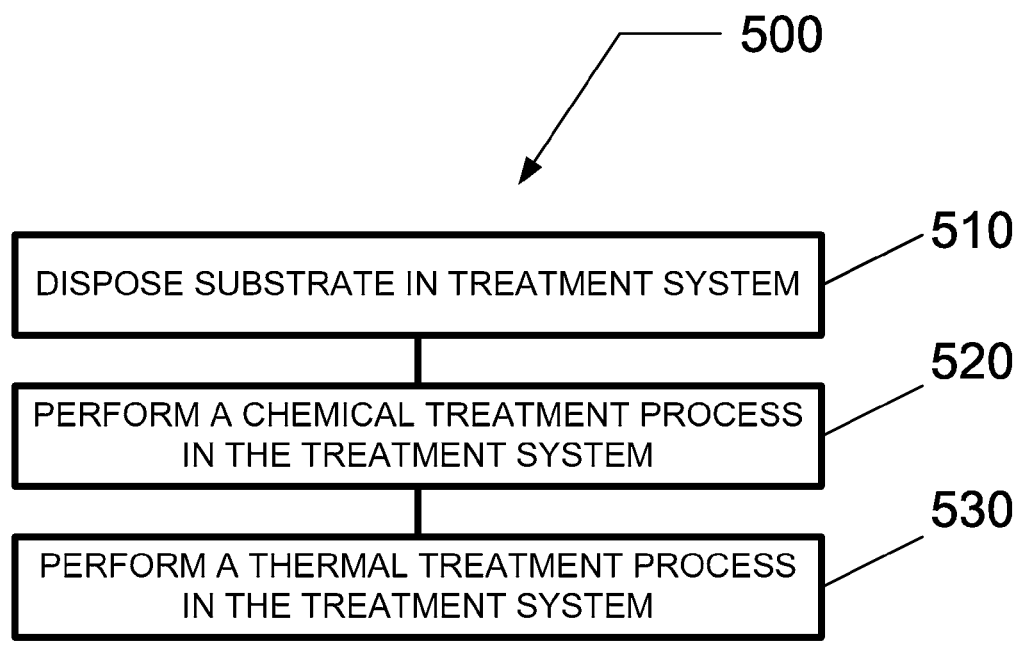
FIG. 5 presents a flow chart of a method of performing a dry, non-plasma chemical removal process according to an embodiment of the present invention.

Referring now to FIG. 5, a method of performing a dry non-plasma treatment of a substrate is presented according to an embodiment. The treatment process can, for example, include a process for removing oxide material on the substrate. The dry, non-plasma treatment process includes a chemical process during which exposed surfaces of a substrate having an oxide material are chemically treated by a process gas comprising HF, or ammonia ($NH_3$), or both HF and $NH_3$ as incipient ingredients. Exposure to incipient HF and/or $NH_3$ can remove oxide material, such as oxidized silicon (or $SiO_x$), and/or consume oxide material by displacing such material with a chemically treated material. The self limiting feature results from a reduced rate of removal and/or chemical altering of the oxide material as exposure to the process material proceeds.

Following the chemical treatment process, a desorption process is performed in order to remove the chemically altered surface layers. Due to the self-limiting feature of the chemical treatment process, it may be desirable to alternatingly perform the non-plasma etch and subsequent desorption process, which can allow precise control of the removal process. The desorption process can comprise a thermal treatment process within which the temperature of the substrate is raised sufficiently high to permit the volatilization of the chemically altered surface layers.

The method includes a flow chart 500 beginning in step 510 with disposing the substrate in a treatment system configured to facilitate the chemical and desorption processes. For example, the treatment system comprises one of the systems described in FIG. 1 or 2.

In step 520, oxide material on the substrate is chemically treated. During the chemical treatment process of the dry non-plasma treatment, each constituent of the process gas may be introduced together (i.e., mixed), or separately from one another (i.e., HF introduced independently from $NH_3$). Additionally, the process gas can further include an inert gas, such as a noble gas (i.e., argon). The inert gas may be introduced with either the HF or the $NH_3$, or it may be introduced independently from each of the aforementioned gaseous constituents. Further details regarding the introduction of a noble gas with $NH_3$ in order to control the removal of silicon dioxide is described in U.S. patent application Ser. No. 10/812,347, entitled "Processing System and Method For Treating a Substrate", the entire contents of which are herein incorporated by reference in their entirety.

Additionally, during the chemical treatment process, the process pressure may be selected to affect the amount of oxide material removed. The process pressure can range from approximately 1 mtorr to approximately 100 torr. Furthermore, during the chemical treatment process, the substrate temperature may be selected to affect the amount of oxide material removed. The substrate temperature can range from approximately 10 degrees C. to approximately 200 degrees C., or the substrate temperature can be less than 100 degrees C. For example, the temperature can range from approximately 10 degrees C. to 50 degrees C. Further details regarding the setting of the substrate temperature in order to control the removal amount is described in U.S. patent application Ser. No. 10/817,417, entitled "Method and System For Performing a Chemical Oxide Removal Process", the entire contents of which are herein incorporated by reference in their entirety.

In step 530, chemically altered oxide material on the substrate is thermally treated. During the thermal treatment process, the substrate temperature can be elevated above approximately 50 degrees C., or above approximately 100 degrees C. Additionally, an inert gas may be introduced during the thermal treatment of the substrate. The inert gas may include a noble gas or nitrogen.

Additionally, during the chemical and thermal treatments of the substrate, the process chamber can be configured for a temperature ranging from about 10° to about 450° C. Alternatively, the chamber temperature can range from about 30° to about 60° C. The temperature for the substrate can range from approximately 10° to about 450° C. Alternatively, the substrate temperature can range form about 30° to about 60° C.

In one example, part of or all of an oxide film, such as a native oxide film, is removed on the substrate using a chemical oxide removal process. In another example, part of or all of an oxide film, such as an oxide hard mask, is trimmed on a substrate using a chemical oxide removal process. The oxide film can comprise silicon dioxide ($SiO_2$), or more generally, $SiO_x$, for example. In yet another example, part or all of a $SiO_x$-containing residue is removed on the substrate.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method of removing material on a substrate, comprising:
    disposing a substrate on a temperature controlled substrate holder mounted within a temperature controlled process chamber, said temperature controlled process chamber configured to facilitate a non-plasma environment, and said temperature controlled substrate holder configured to support said substrate, such that a surface of said substrate is oriented to be treated by said non-plasma environment, and configured to control a temperature of said substrate when said substrate is resting on an upper surface of said temperature controlled substrate holder;
    evacuating said temperature controlled process chamber using a pumping system coupled to said temperature controlled process chamber;
    chemically treating said substrate within said temperature controlled process chamber using a chemical treatment system coupled to said temperature controlled process chamber by exposing said substrate to a process gas composition selected to chemically alter exposed surface layers on said substrate;
    setting a temperature of said substrate to a substrate temperature less than 100 degrees C. during said chemically treating;

following said chemically treating, thermally treating said substrate within said temperature controlled process chamber using a thermal treatment system coupled to said temperature controlled process chamber by heating said substrate to a temperature sufficient to cause evaporation of said chemically altered surface layers, wherein said substrate temperature is elevated to a temperature greater than or equal to 100 degrees C.; and performing said chemically treating and said thermally treating in tandem to remove material from said substrate.

2. The method of claim 1, wherein said process gas composition comprises as incipient ingredients HF and optionally ammonia ($NH_3$).

3. The method of claim 1, wherein said process gas composition comprises as incipient ingredients F, N, and H.

4. The method of claim 1, wherein said process gas composition further comprises a noble gas.

5. The method of claim 1, further comprising:
alternatingly performing said chemically treating and said thermally treating to remove material from said substrate.

6. The method of claim 1, further comprising:
introducing a noble gas or nitrogen during said thermally treating.

7. The method of claim 1, wherein a pressure in said temperature controlled process chamber ranges from about 1 mTorr to about 100 Torr during said chemically treating.

8. The treatment system of claim 1, wherein said process gas composition comprises as incipient ingredients HF and ammonia ($NH_3$), and wherein said HF is introduced independently from said ammonia.

9. The method of claim 1, wherein said process gas composition chemically alters exposed surface layers on said substrate to a self-limiting depth.

10. The method of claim 1, further comprising:
prior to said thermally treating said substrate, displacing said substrate from thermal contact with said temperature controlled substrate holder to a raised position.

11. The method of claim 10, further comprising:
disposing a radiation shield in said temperature controlled process chamber that is configured to surround a peripheral edge of said thermal treatment system, wherein said thermal treatment system comprises a radiative heating system; and forming a substantially closed space bounded by said radiative heating system, said radiation shield and said substrate in said raised position.

12. The method of claim 10, further comprising:
during said thermally treating said substrate, introducing a purge gas to the backside of said substrate between said substrate and said temperature controlled substrate holder in order to reduce the transport of contaminants to the backside of said substrate.

* * * * *